US009214203B2

(12) United States Patent
Wang et al.

(10) Patent No.: US 9,214,203 B2
(45) Date of Patent: Dec. 15, 2015

(54) SENSING APPARATUS AND DATA SENSING METHOD THEREOF

(71) Applicant: eMemory Technology Inc., Hsinchu (TW)

(72) Inventors: Po-Ping Wang, Yilan County (TW); Cheng-Da Huang, Hsinchu County (TW); Chun-Hung Lin, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 27 days.

(21) Appl. No.: 14/178,277

(22) Filed: Feb. 12, 2014

(65) Prior Publication Data

US 2015/0228315 A1    Aug. 13, 2015

(51) Int. Cl.
| G11C 7/06 | (2006.01) |
| G11C 7/12 | (2006.01) |
| G11C 7/10 | (2006.01) |
| G11C 5/06 | (2006.01) |
| G11C 7/22 | (2006.01) |

(52) U.S. Cl.
CPC .. G11C 7/12 (2013.01); G11C 5/06 (2013.01); G11C 7/106 (2013.01); G11C 7/22 (2013.01)

(58) Field of Classification Search
CPC .. G11C 7/062; G11C 7/067; G11C 2207/063; G11C 16/26; G11C 16/28; G11C 7/12; G11C 7/22; G11C 5/06
USPC ...................... 365/189.07, 189.15, 203, 210.1
See application file for complete search history.

(56) References Cited

U.S. PATENT DOCUMENTS

| 7,272,059 | B2 |  | 9/2007 | Vimercati et al. |
| 7,466,614 | B2 | * | 12/2008 | Wang ............................. 365/205 |
| 7,515,493 | B2 |  | 4/2009 | Di Vincenzo et al. |
| 8,189,402 | B2 |  | 5/2012 | Lin |
| 8,339,884 | B2 | * | 12/2012 | Huang ................... G11C 7/067 365/185.25 |
| 2008/0084758 | A1 | * | 4/2008 | Wang ....................... 365/185.21 |
| 2011/0310678 | A1 | * | 12/2011 | Lin ........................... 365/189.07 |
| 2012/0182818 | A1 | * | 7/2012 | Huang ................... G11C 7/067 365/203 |

OTHER PUBLICATIONS

"Office Action of Taiwan Counterpart Application", issued on Sep. 1, 2015, p. 1-p. 11.

* cited by examiner

*Primary Examiner* — Pho M Luu
*Assistant Examiner* — Xiaochun L Chen
(74) *Attorney, Agent, or Firm* — Jianq Chyun IP Office

(57) ABSTRACT

A sensing apparatus and data sensing method are provided. The sensing apparatus includes an initial circuit, a reference current generator and a sensing circuit. The initial circuit discharges a sensing end to a reference ground during a discharge period, and pre-charges the sensing end to a preset voltage level during a pre-charge period according to an output signal. The reference current generator draws a reference current from the sensing end. The sensing circuit senses a voltage level on the sensing end to generate the output signal. Wherein, the sensing end receives a cell current from a memory cell, and the pre-charge period is after the discharge period.

16 Claims, 6 Drawing Sheets

SENSING APPARATUS AND DATA SENSING METHOD THEREOF

BACKGROUND OF THE INVENTION

1. Field of Invention

The present invention generally relates to a sense amplifier and a data sensing method thereof, and more particularly to a sense amplifier and sensing method for reducing the data sensing time.

2. Description of Prior Art

Along with the rapid development of the semiconductor process technique, a voltage level of an operating voltage for an integrated circuit is getting lower. For non-volatile memory cell, a current level of a cell current flowing to a sense amplifier is small when the voltage level of the operating voltage is low (ex. VDD=1.5V/1.2V or 1.0V). When data in the non-volatile memory cell is sensed by a sense amplifier, a long time is needed for the current of the cell to charge a bit line. That is, a data sensing time for a voltage level on a sensing end to rise to larger than a trigger level is long, and the performance of the non-volatile memory cell is limited.

SUMMARY OF THE INVENTION

The present invention provides a sensing apparatus for reducing the sensing time for sensing data from memory cell.

The present invention provides a data sensing method for reducing the sensing time for sensing data from memory cell The sensing apparatus provided by the present invention includes an initial circuit, a reference current generator and a sensing circuit. The initial circuit is coupled to a sensing end. The initial circuit discharges the sensing end to a reference ground during a discharge period, and pre-charges the sensing end to a preset voltage level during a pre-charge period according to an output signal. The reference current generator is coupled to the sensing end and draws a reference current from the sensing end. The sensing circuit is coupled to the sensing end for sensing a voltage level on the sensing end to generate the output signal. Wherein, the sensing end receives a cell current from a memory cell, and the pre-charge period is after the discharge period.

The steps of the data sensing method provided by the present invention includes: discharging a voltage level on a sensing end to a reference ground during a discharge period by an initial circuit; pre-charging the voltage level on the sensing end to a preset voltage level during a pre-charge period according to an output signal by the initial circuit; receiving a cell current from the memory cell by the sensing end; drawing a reference current from the sensing end by a reference current generator; and generating the output signal by sensing the voltage level on the sensing end by a sensing circuit. Wherein, the pre-charge period is after the discharge period.

Accordingly, the sensing apparatus provided by present invention pulls up the voltage level on the sensing end to the preset voltage level during the pre-charge period. That is, when the pre-charge period is finished, the voltage level can be raised to larger than the trigger voltage level quickly, and the necessary sensing time for the sensing apparatus can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
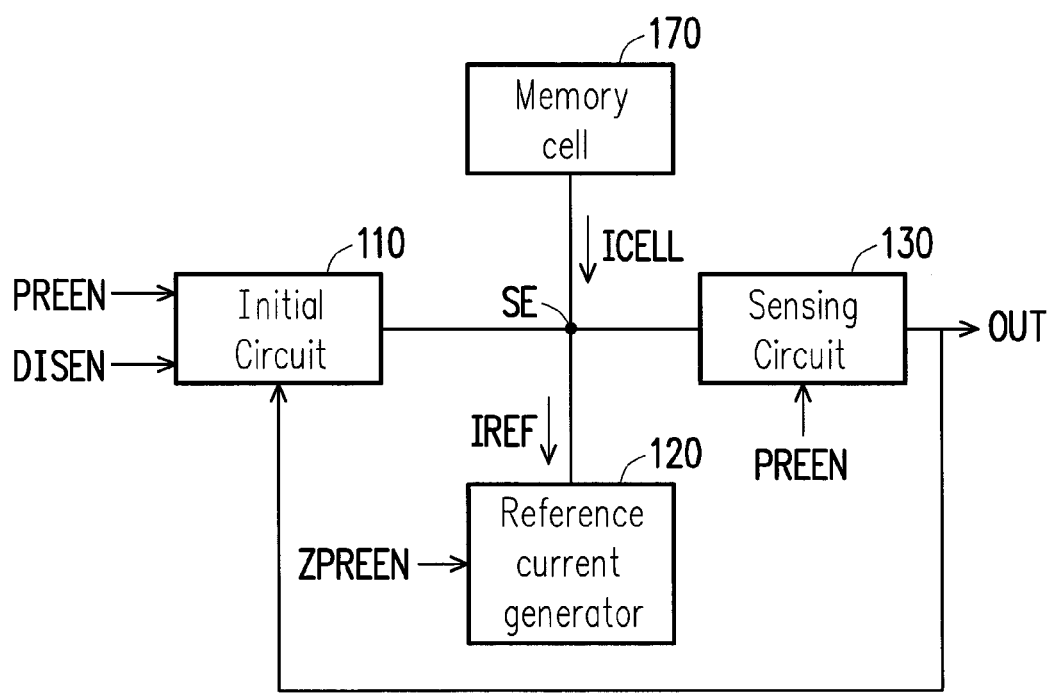
FIG. 1 is a block diagram of a sensing apparatus 100 according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1, FIG. 1 is a block diagram of a sensing apparatus 100 according to an embodiment of the present invention. The sensing apparatus 100 includes an initial circuit 110, a reference current generator 120, and a sensing circuit 130. The initial circuit 110 is coupled to a sensing end SE, and the sensing end SE further coupled to a memory cell 170. The memory cell 170 may be one of the cells of a non-volatile memory. The initial circuit 110 receives a pre-charge enable signal PREEN and a discharge enable signal DISEN, and the initial circuit 110 also receives an output signal OUT feedback from the sensing circuit 130. The initial circuit 110 may discharge the sensing end SE to a reference ground according to the discharge enable signal DISEN, or the initial circuit 110 may pre-charge the sensing end SE to a preset voltage level according to the pre-charge enable signal PREEN and the output signal OUT. In the embodiment, the pre-charge enable signal PREEN is used to indicate whether the sensing apparatus 100 is in a pre-charge period or not, and the discharge enable signal DISEN is used to indicate whether the sensing apparatus 100 is in a discharge period or not. Moreover, the discharge period is before the pre-charge period.

The reference current generator 120 is coupled to the sensing end SE. The reference current generator 120 generates a reference current IREF, and the reference current generator 120 draws the reference current IREF from the sensing end SE to the reference round. In the embodiment, the memory cell 170 provides a cell current ICELL to the sensing end SE, and the reference current generator 120 draws the reference current IREF from the sensing end SE. Such as that, a current comparing operation is operated on the sensing end SE. When the cell current ICELL is higher than the reference current IREF, a voltage level on the sensing end SE is raised. On the contrary, when the cell current ICELL is lower than the reference current IREF, the voltage level on the sensing end SE is reduced. Moreover, when the cell current ICELL equals to the reference current IREF, the voltage level on the sensing end SE is not varied.

On the other hand, the reference current generator 120 receives an inverted pre-charge enable signal ZPREEN. The reference current generator 120 decides whether to generate the reference current IREF or not according to the inverted pre-charge enable signal ZPREEN, and the inverted pre-charge enable signal ZPREEN and the pre-charge enable signal PREEN are complementary. That is, the reference current IREF is not generated during the pre-charge period.

The sensing circuit 130 is coupled to the sensing end SE. The sensing circuit 130 senses the voltage level on the sensing end SE to generate the output signal OUT. For example, the sensing circuit 130 may detect whether the voltage level on the sensing end SE is higher than a trigger voltage level or not for generating the output signal. In detail, when the voltage level on the sensing end SE is higher than the trigger voltage level, the sensing circuit 130 may determine the output signal to be a first logic state. On the contrary, when the voltage level on the sensing end SE is not higher than the trigger voltage level, the sensing circuit 130 may determine the output signal to be a second logic state. The sensing circuit 130 further receives the pre-charge enable signal PREEN, and the sensing circuit 130 may provide a current drawing from an output end of the sensing circuit 130 to the reference ground during the pre-charge period. The current provided by the sensing circuit 130 can the output signal OUT from overshooting.

It should be noted here, the trigger voltage level is larger the preset voltage level. The preset voltage level may be determined by a designer according to the trigger voltage level.

In the operation of the sensing apparatus 100, firstly, in the discharge period, the initial circuit 110 discharges the sensing end SE to the reference ground (ex. 0V). Then, after the discharge period and in the pre-charge period, the initial circuit 110 pre-charges the sensing end SE to the preset voltage level. After the pre-charge period, the reference current generator 120 provides the reference current IREF drawing from the sensing end SE. When the memory cell 170 is accessed, the memory cell 170 provides the cell current ICELL to the sensing end SE, and the voltage level on the sensing end SE is varied by comparing the cell current ICELL and the reference current IREF. If the cell current ICELL is larger than the reference current IREF, the voltage level on the sensing end SE may increase to larger than the trigger voltage level from the preset voltage level quickly, and the sensing circuit 130 can generates the output signal OUT quickly by sensing the voltage level on the sensing end SE.

On the other hand, if the cell current ICELL is not larger than the reference current IREF, the voltage level on the sensing end SE reduced from the preset voltage level to the reference ground. The sensing circuit 130 can generates the output signal OUT quickly by sensing the voltage level on the sensing end SE.

Figure 2:
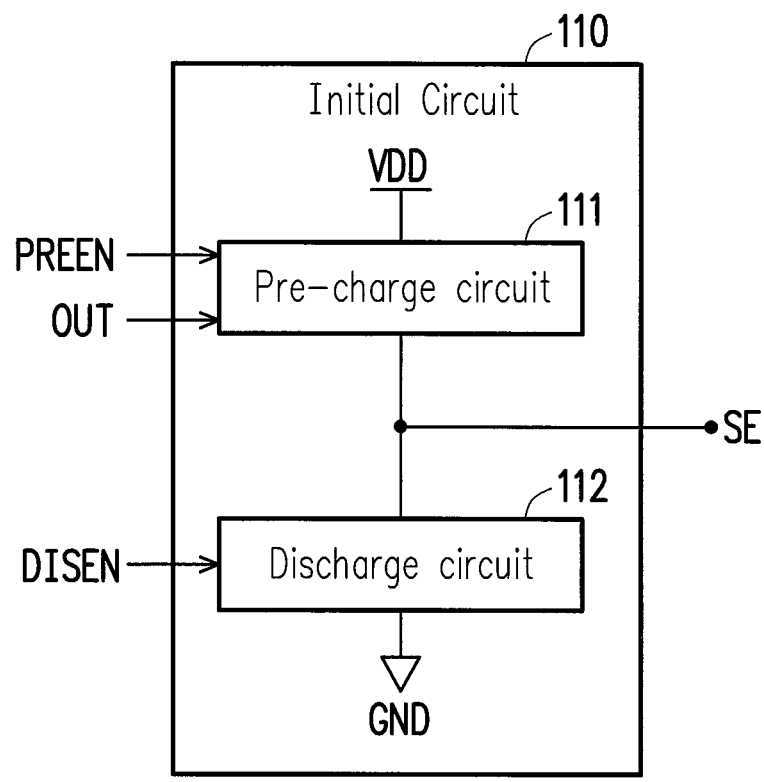
FIG. 2 is a block diagram of the initial circuit 110 according to the embodiment of the present invention.

Referring to FIG. 2, FIG. 2 is a block diagram of the initial circuit 110 according to the embodiment of the present invention. The initial circuit 110 includes a pre-charge circuit 111 and a discharge circuit 112. The pre-charge circuit 111 is coupled to the reference operating voltage Vdd and the sensing end SE. The pre-charge circuit 111 receives the pre-charge enable signal PREEN and the output signal OUT, and the pre-charge circuit 111 pre-charges the sensing end SE to the preset voltage level according to the output signal OUT during the pre-charge period.

The discharge circuit 112 is coupled to the reference ground GND and the sensing end SE. The discharge circuit 112 receives the discharge enable signal DISEN, and discharge the sensing end SE to the reference ground GND during the discharge period.

Figure 3A:
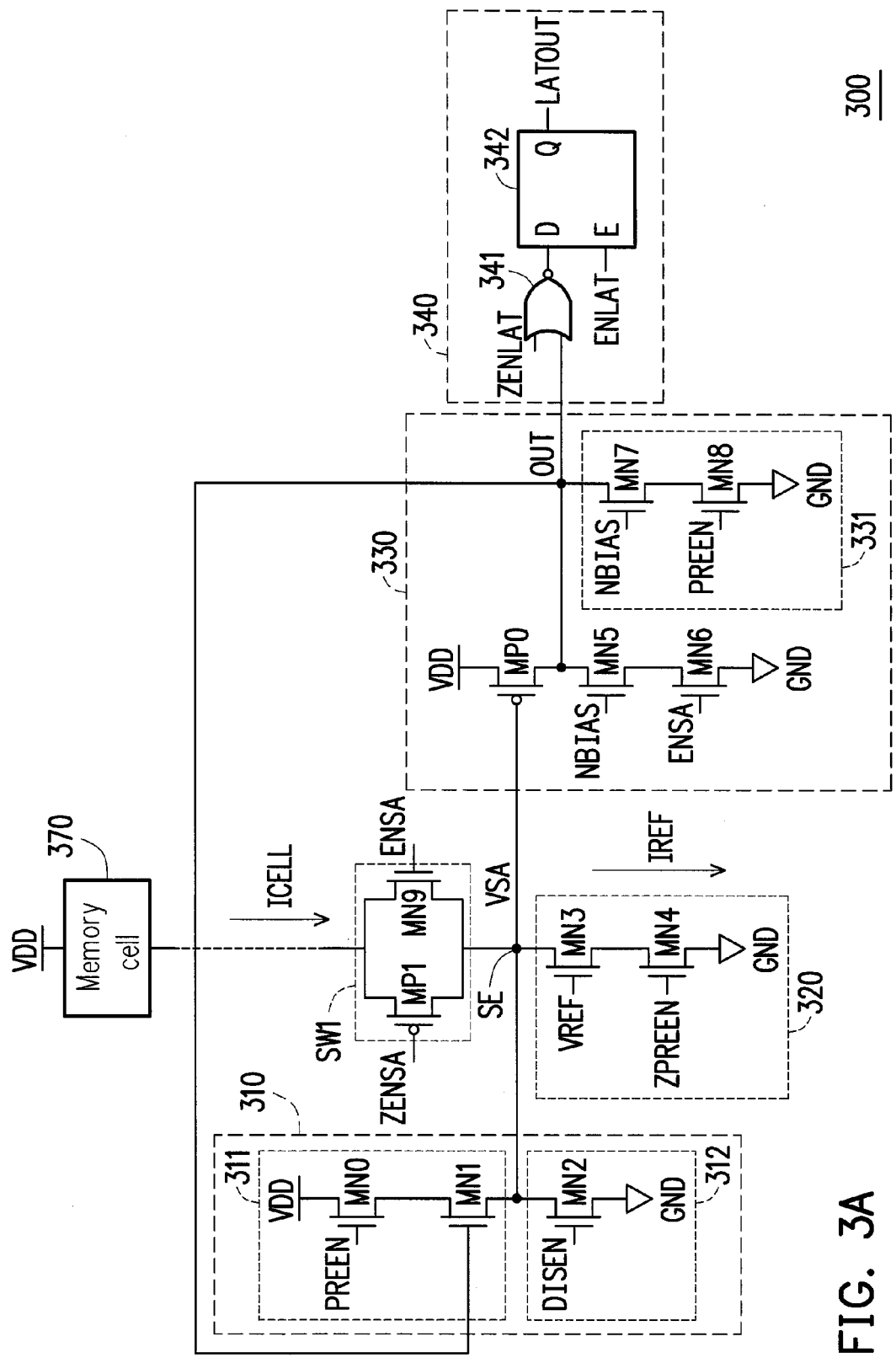
FIG. 3A is a circuit diagram of a sensing apparatus 300 according to another embodiment of the present invention.

Referring to FIG. 3A, FIG. 3A is a circuit diagram of a sensing apparatus 300 according to another embodiment of the present invention. The sensing apparatus 300 is coupled to the memory cell 370 for reading a data stored in the memory cell 370. The sensing apparatus 300 includes an initial circuit 310, a reference current generator 320, a sensing circuit 330, a latch circuit 340 and a switch SW1.

The switch SW1 is coupled between a sensing end SE and the memory cell 370. The switch SW1 is controlled by a sense amplifier enable signal ENSA and an inverted sense amplifier enable signal ZENSA. In this embodiment, the switch SW1 includes a transmission gate. A first and second ends of the transmission gate are respectively coupled to the memory cell 370 and the sensing end SE. A positive and negative control ends of the transmission gate are respectively receive the sensing apparatus enable signal ENSA and the inverted sensing apparatus enable signal ZENSA. The sensing apparatus enable signal ENSA and the inverted sensing apparatus enable signal ZENSA are complementary. When a data stored in the memory cell 370 is read, the switch SW1 is turned on according to the sensing apparatus enable signal ENSA and the inverted sensing apparatus enable signal ZENSA, and when the memory cell 370 is not accessed, the switch SW1 is turned off.

The transmission gate of the switch SW1 is formed by transistors MP1 and MN9. The transistor MP1 is P-type MOSFET, and the transistor MN9 is N-type MOSFET.

The initial circuit 310 includes a pre-charge circuit 311 and a discharge circuit 312. The pre-charge circuit 311 includes transistors MN0 and MN1. A first end of the transistor MN0 is coupled to the reference operating voltage VDD, a control end of the transistor MN0 receives the pre-charge enable signal PREEN, and a second end of the transistor MN0 is coupled to a first end of the transistor MN1. A control end of the transistor MN1 is coupled to the sensing circuit 330 form receiving the output signal OUT. A second end of the transistor MN1 is coupled to the sensing end SE. The discharge circuit 312 includes a transistor MN2. A first end of the transistor MN2 is coupled to the sensing end SE, and a control end of the transistor MN2 receives a discharge enable signal DISEN, and a second end of the transistor MN2 is coupled to a reference ground GND. Beside, the transistors MN0-MN2 are N-type transistors.

The reference current generator 320 includes a transistor MN3 and a transistor MN4. A first end of the transistor MN3 is coupled to the sensing end SE, a control end of the transistor MN3 receives a reference voltage VREF, and a second end of the transistor MN3 is coupled to a first end of the transistor MN4. A control end of the transistor MN4 receives an inverted pre-charge enable signal ZPREEN, and a second end of the transistor MN4 is coupled to the reference ground GND.

The transistor MN4 performs a switch, and controlled by the inverted pre-charge enable signal ZPREEN. The transistor MN4 coupled the transistor MN3 to the reference ground GND when the sensing apparatus 300 is not in the pre-charge period. The transistor MN3 performs a current source, and provides the reference current IREF according to the reference voltage VREF when the transistor MN4 is turned on.

The sensing circuit 330 includes transistors MP0, a current generator (MN5 and MN6) and an overshoot prevention circuit 331. The transistors MP0, MN5 and MN6 form a circuit for sensing the voltage level VSA on the sensing end SE. A first end of the transistor MP0 is coupled to the reference operating voltage VDD, a control end of the transistor MP0 is coupled to the sensing end SE, and a second end of the transistor MP0 is an output end of the sensing circuit 330, and the output end of the sensing circuit 330 is coupled to a first end of the transistor MN5. Further, a control end of the transistor MN5 receives a bias voltage NBIAS, and a second end of the transistor MN5 is coupled to a first end of the transistor MN6. A control end of the transistor MN6 receives the sense amplifier enable signal ENSA, and a second end of the transistor MN6 is coupled to the reference ground GND.

The overshoot prevention circuit 331 is coupled between the output end of the sensing circuit 330 and the reference ground GND. The overshoot prevention circuit 331 includes transistors MN7 and MN8. The transistor MN7 is coupled between the transistor MN8 and the output end of the sensing circuit 330, and the transistor MN7 is controlled by the bias voltage NBIAS to perform a current source. The transistor MN8 performs a switch, and coupled between the transistor MN7 and the reference ground. The transistor is controlled by the pre-charge enable signal PREEN, and is turned on during the pre-charge period.

The overshoot prevention circuit 331 provides a current generated by the transistor MN7 during the pre-charge period to prevent the output signal OUT from overshooting. A data sensing fault event during the pre-charge period can be avoided.

The latch circuit 340 is coupled to the sensing circuit 330 to receive the output signal OUT. The latch circuit 340 latches the output signal OUT according a latch signal ENLAT. The latch signal ENLAT may be enable after the pre-charge period. In this embodiment, the latch circuit 340 includes a logic gate (NOR gate) 341 and a latch gate 342. The logic gate 341 receives the output signal OUT and an inverted latch enable signal ZENLAT, and the logic gate 341 decides to transmit the output signal OUT to an output end of the logical gate 341 or not according to the inverted latch signal ZENLAT. In this embodiment, the output signal OUT is inverted and the inverted output signal is transported to the output end of the logical gate 341 when the inverted latch enable signal ZENLAT is logic low.

The latch gate 342 has a data end, an enable end, and an output end. The data end D of the latch gate 342 is coupled to the output end of the logical gate 341, the enable end E of the latch gate 342 receives the latch enable signal ENLAT, and the output end Q of the latch gate 342 outputs a latched output signal LATOUT.

Figure 3B:
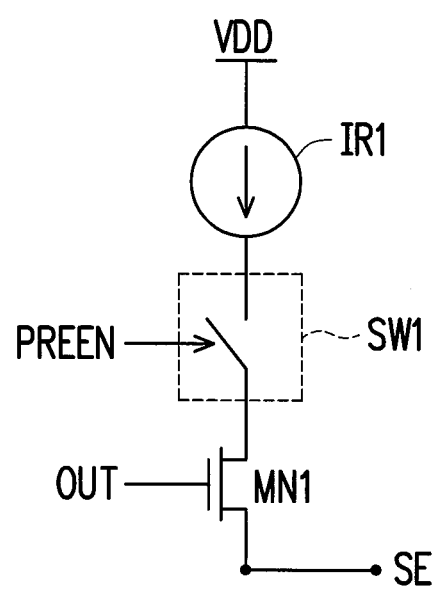
FIG. 3B is a circuit diagram of the pre-charge circuit 311 according to another embodiment of the sensing apparatus 300.

Referring to FIG. 3B, FIG. 3B is a circuit diagram of the pre-charge circuit 311 according to another embodiment of the sensing apparatus 300. In FIG. 3B, the pre-charge circuit 311 includes a current source IR1, a switch SW1, and a transistor MN1. The current source IR1 is coupled to the reference operating voltage VDD and generates a reference current. The reference current is provided to the switch SW1. The two ends of the switch SW1 are respectively coupled to the current source IR1 and the transistor MN1. The switch SW1 is controlled by the pre-charge enable signal PREEN to be turned on or off. When the switch SW1 is turned on according to the pre-charge enable signal PREEN, the reference current generated by the current source IR1 can be provided to the first end of the transistor MN1. The second end of the transistor MN1 is coupled to the sensing end SE, and the control end of the transistor MN1 receives the output signal OUT. Different from FIG. 3A, the transistor MN0 is replace to the current source IR1 and switch SW1 in FIG. 3B.

Figure 4:
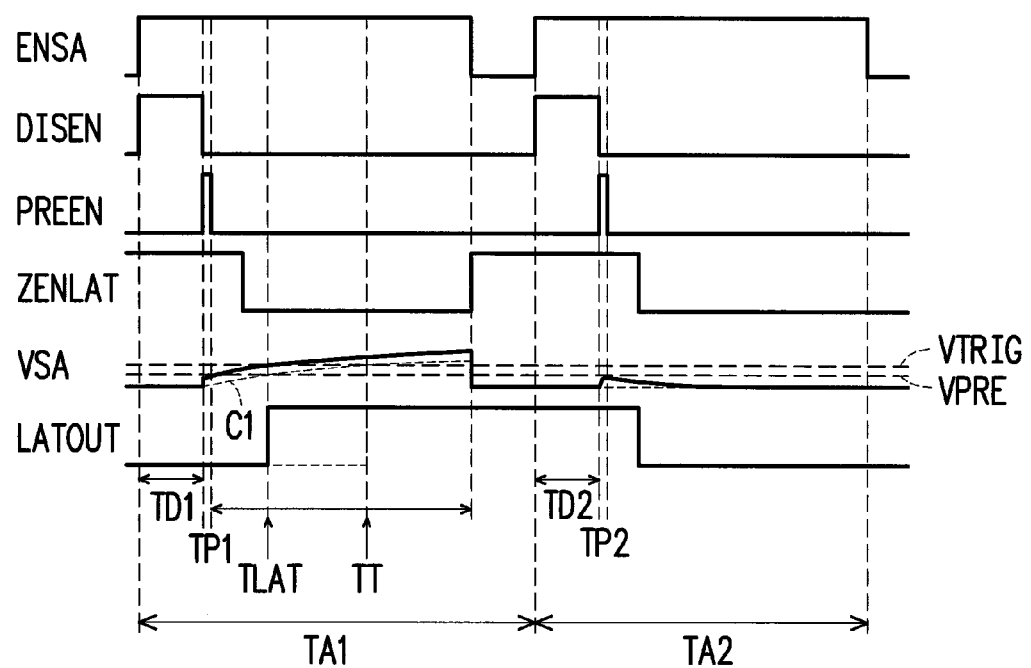
FIG. 4 is a waveform plot according to the embodiment of the present invention.

Referring to FIG. 3A and FIG. 4, wherein, FIG. 4 is a waveform plot according to the embodiment of the present invention. The timing period TA1 is used for sensing a memory cell which is programmed to a first logic level ("0" for example). During the timing period TA1, the memory cell 370 is programmed and is sensed by the sensing apparatus 300. Firstly, during the discharge period TD1, the sense amplifier enable signal ENSA and the discharge enable signal DISEN are enable (be pulled to logic high), and the voltage level VSA on the sensing end SE is pulled to the reference ground (ex. 0V). Then, during pre-charge period TP1, the discharge signal DISEN is pulled to logic low, the pre-charge signal is pulled to logic high, and the voltage level VSA on the sensing end SE is pulled to the preset voltage level VPRE. Wherein, the preset voltage level VPRE is lower than the trigger voltage level VTRIG. When the pre-charge period TP1 is finished, the voltage level VSA is gradually increased by the comparing result of the cell current ICELL and the reference current IREF. At the time point TLAT, the voltage level VSA is not lower than the trigger voltage level VTRIG, and a correct output signal OUT can be generated. That is, the latch circuit 340 can latch the correct output signal OUT at the time point TLAT, and the correct latched output signal LATOUT can be obtained quickly.

Please referring to the curve C1, if the voltage level VSA is not pulled to the preset voltage level VPRE in the pre-charge period TP1, the correct latched output signal LATOUT can be obtained after the time point TT. Apparently, the response speed of the sensing apparatus 300 is improved.

In another case, the timing period TA2 is used for sensing a memory cell which is programmed or erased to a second logic level ("1" for example). During the timing period TA2, the memory cell 370 is erased and is sensed by the sensing apparatus 300. Firstly, during the discharge period TD2, the sense amplifier enable signal ENSA and the discharge enable signal DISEN are enable (be pulled to logic high), and the voltage level VSA on the sensing end SE is pulled to the reference ground (ex. 0V). Then, during the pre-charge period TP2, the voltage level VSA on the sensing end SE is pulled to the preset voltage level VPRE. It should be noted here, the voltage level VSA on the sensing end SE is prevented from rising over the trigger voltage level VTRIG by the overshoot prevention circuit 331, and the latched output signal LATOUT with logic low can be obtained when the inverted latch enable signal ZENLAT is pulled to logic low during the timing period TA2. After the pre-charge period TP2, the voltage level VSA is pulled down to the reference ground GND by comparing the reference current IREF and the cell current ICELL.

In additional, a memory cell which is programmed to a first logic level ("0" for example) has a larger cell current ICELL than a memory cell which is programmed to a second logic level ("1" for example) or erased. And the first logic level and the second logic level are complementary.

Figure 5:
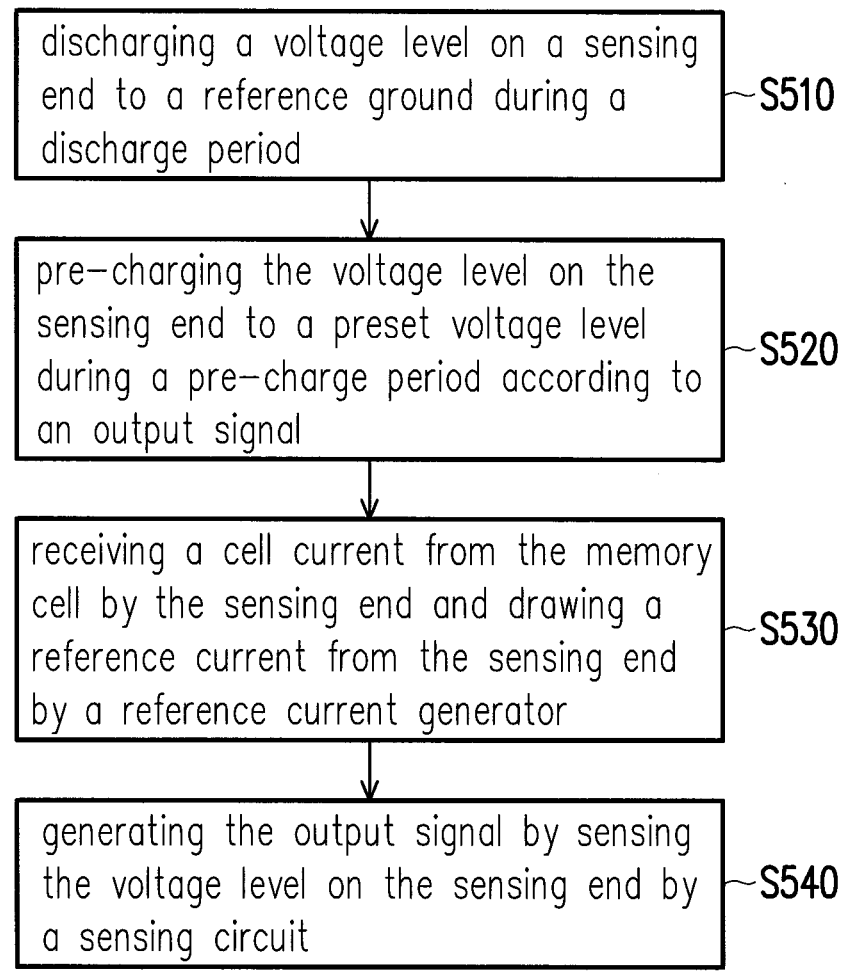
FIG. 5 is a flow chart of a data sensing method according to an embodiment of the present invention.

Referring to FIG. 5, FIG. 5 is a flow chart of a data sensing method according to an embodiment of the present invention. In step S510, a voltage level on a sensing end is discharged to a reference ground during a discharge period by an initial circuit. In step S520, the voltage level on the sensing end is pre-charged to a preset voltage level during a pre-charge period according to an output signal by the initial circuit. Further, in step S530, a cell current from the memory cell is received by the sensing end, and a reference current is drew from the sensing end by a reference current generator. Finally, in step S540, the output signal is generated by sensing the voltage level on the sensing end by a sensing circuit.

The details of the steps S510-S540 can be realized by the description of the embodiments mentioned above.

In summary, the sensing apparatus of present invention provides an initial circuit for pre-charging the voltage level of the sensing end to a preset voltage level. That is, a response time for sensing data by the sensing apparatus can be reduced, and a performance of the memory can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents

What is claimed is:

1. A sensing apparatus, comprising:
    an initial circuit, coupled to a sensing end, the initial circuit discharging the sensing end to a reference ground during a discharge period, and pre-charging the sensing end to a preset voltage level during a pre-charge period according to an output signal;
    a reference current generator, coupled to the sensing end and drawing a reference current from the sensing end; and
    a sensing circuit, coupled to the sensing end for sensing a voltage level on the sensing end to generate the output signal by sensing whether the voltage level on the sensing end is larger than a trigger voltage level or not, wherein, the trigger voltage level is larger than the preset voltage level,
    wherein, the sensing end receives a cell current from a memory cell, and the pre-charge period is after the discharge period,
    wherein the sensing circuit comprises:
        a first transistor, has a first end, a second end and a control end, the first end of the first transistor is coupled to a reference operating voltage, the control end of the first transistor is coupled to the sensing end; and
        a current generator, coupled between the second end of the first transistor and the reference ground, the current generator provides a current flowing from the second end of the first transistor to the reference ground,
        wherein the current generator comprises:
            a second transistor, has a first end, a second end and a control end, the first end of the second transistor is coupled to a output end of the sensing circuit, the control end of the second transistor receives a bias voltage; and
            a third transistor, has a first end, a second end and a control end, the first end of the third transistor is coupled to the second end of the second transistor, the control end of the third transistor receives a sense amplifier enable signal, and the second end of the third transistor is coupled to the reference ground.

2. The sensing apparatus according to claim 1, wherein the sensing circuit further comprises:
    an overshoot prevention circuit, coupled to the output end of the sensing circuit for generating the output signal, the overshoot prevent circuit draws a current from the output end of the sensing circuit during the pre-charge period.

3. The sensing apparatus according to claim 2, wherein the overshoot prevention circuit comprises:
    a fourth transistor, has a first end, a second end, and a control end, the first end of the fourth transistor is coupled to the output end of the sensing circuit, the control end of the fourth transistor receives the bias voltage; and
    a fifth transistor, has a first end, a second end, and a control end, the first end of the fifth transistor is coupled to the second end of the fourth transistor, the control end of the fifth transistor receives a pre-charge enable signal, and the second end of the fifth transistor is coupled to the reference ground.

4. The sensing apparatus according to claim 1, wherein the initial circuit comprises:
    a pre-charge circuit, coupled to the sensing end, and the pre-charge circuit pre-charges the sensing end to a preset voltage level during the pre-charge period; and
    a discharge circuit, coupled to the sensing end, and the discharge circuit discharges the sensing end to a reference ground during the discharge period.

5. The sensing apparatus according to claim 4, wherein the pre-charge circuit comprises:
    a sixth transistor, has a first end, a second end, and a control end, the first end of the sixth transistor is coupled to a reference operating voltage, a control end of the sixth transistor receives a pre-charge enable signal; and
    a seventh transistor, has a first end, a second end, and a control end, the first end of the seventh transistor is coupled to the second end of the sixth transistor, a control end of the seventh transistor receives the output signal, and the second end of the seventh transistor is coupled to the sensing end.

6. The sensing apparatus according to claim 4, wherein the pre-charge circuit comprises:
    a current source, coupled to a reference operating voltage and generates a reference current;
    a switch, has a first end and a second end, the first end of the switch is coupled to the current source, wherein the switch receives a pre-charge enable signal and is turned on or off according to the pre-charge enable signal; and
    a sixth transistor, has a first end, a second end, and a control end, the first end of the sixth transistor is coupled to the second end of the switch, a control end of the sixth transistor receives the output signal, and the second end of the sixth transistor is coupled to the sensing end.

7. The sensing apparatus according to claim 5, wherein the discharge circuit comprises:
    an eighth transistor, has a first end, a second end, and a control end, the first end of the eighth transistor is coupled to the sensing end, the control end of the eighth transistor receives a discharge enable signal, and the second end of the eighth transistor is coupled to the reference ground.

8. The sensing apparatus according to claim 1, wherein the reference current generator comprise:
    a ninth transistor, has a first end, a second end, and a control end, the first end of the ninth transistor is coupled to the sensing end, the control end of the ninth transistor receives a reference voltage; and
    a tenth transistor, has a first end, a second end, and a control end, the first end of the tenth transistor is coupled to the second end of the ninth transistor, the control end of the tenth transistor receives an inverted pre-charge enable signal, and the second end of the tenth transistor is coupled to the reference ground.

9. The sensing apparatus according to claim 1, further comprising:
    a switch, coupled between the sensing end and the memory cell, the switch being controlled by a sensing apparatus enable signal.

10. The sensing apparatus according to claim 9, wherein the switch comprises:
    a transmission gate, has a first end, a second end, a positive control end and a negative control end, the first end is coupled to the memory cell, the second end is coupled to the sensing end, the positive end receives the sense amplifier enable signal, and the negative end receives an inverted sense amplifier enable signal.

11. The sensing apparatus according to claim 1, further comprising:

a latch circuit, coupled to the sensing circuit for receiving and latching the output signal.

12. The sensing apparatus according to claim 11, wherein the latch circuit comprises:
a logical gate, receives the output signal and an inverted latch enable signal, and decides to transmit the output signal to an output end of the logical gate or not according to the inverted latch signal; and
a latch gate, coupled to the output end of the logical gate, the latch gate latches the signal on the output end of the logical gate according to a latch signal.

13. A data sensing method, suitable for sensing data from a memory cell, comprising:
discharging a voltage level on a sensing end to a reference ground during a discharge period by an initial circuit;
pre-charging the voltage level on the sensing end to a preset voltage level during a pre-charge period according to an output signal by the initial circuit;
receiving a cell current from the memory cell by the sensing end;
drawing a reference current from the sensing end by a reference current generator;
drawing a current from an output end of the sensing circuit during the pre-charge period by the sensing circuit; and
generating the output signal by sensing the voltage level on the sensing end by a sensing circuit,
wherein, the pre-charge period is after the discharge period.

14. The data sensing method according to claim 13, wherein the steps of the generating the output signal by sensing the voltage level on the sensing end comprises:
generating the output signal by sensing whether the voltage level on the sensing end is larger than a trigger voltage level or not, wherein, the trigger voltage level is larger than the preset voltage level.

15. The data sensing method according to claim 13, further comprising:
latching the output signal according to a sense amplifier enable signal by a latch circuit.

16. A sensing apparatus, comprising:
an initial circuit, coupled to a sensing end, the initial circuit discharging the sensing end to a reference ground during a discharge period, and pre-charging the sensing end to a preset voltage level during a pre-charge period according to an output signal;
a reference current generator, coupled to the sensing end and drawing a reference current from the sensing end; and
a sensing circuit, coupled to the sensing end for sensing a voltage level on the sensing end to generate the output signal,
wherein, the sensing end receives a cell current from a memory cell, and the pre-charge period is after the discharge period,
wherein the reference current generator comprise:
a ninth transistor, has a first end, a second end, and a control end, the first end of the ninth transistor is coupled to the sensing end, the control end of the ninth transistor receives a reference voltage; and
a tenth transistor, has a first end, a second end, and a control end, the first end of the tenth transistor is coupled to the second end of the ninth transistor, the control end of the tenth transistor receives an inverted pre-charge enable signal, and the second end of the tenth transistor is coupled to the reference ground.

* * * * *